United States Patent
Park et al.

(10) Patent No.: US 7,200,049 B2
(45) Date of Patent: Apr. 3, 2007

(54) METHODS FOR ACCELERATED ERASE OPERATIONS IN NON-VOLATILE MEMORY DEVICES AND RELATED DEVICES

(75) Inventors: Jae-Woo Park, Gyeonggi-do (KR); Jae-Yong Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/247,839

(22) Filed: Oct. 11, 2005

(65) Prior Publication Data

US 2006/0104104 A1  May 18, 2006

(30) Foreign Application Priority Data

Nov. 18, 2004  (KR) .................. 10-2004-0094701
Nov. 19, 2004  (KR) .................. 10-2004-0095242

(51) Int. Cl.
    *G11C 11/34* (2006.01)
(52) U.S. Cl. .................. 365/185.29; 365/185.22; 365/185.23
(58) Field of Classification Search .......... 365/100, 365/185.29, 185.3, 185.22, 185.23, 185.24, 365/185.05
See application file for complete search history.

(56) References Cited

U.S. PATENT DOCUMENTS

| 5,267,209 A | * | 11/1993 | Yoshida | .................. 365/185.27 |
| 5,856,942 A | * | 1/1999 | Lee et al. | .................. 365/185.11 |
| RE37,419 E | * | 10/2001 | Hsu et al. | .................. 365/185.11 |
| 6,345,000 B1 | * | 2/2002 | Wong et al. | ............. 365/185.29 |
| 6,771,541 B1 | | 8/2004 | Park | |
| 6,842,378 B2 | | 1/2005 | Chang | |
| 7,031,197 B2 | * | 4/2006 | Yoshida | .................. 365/185.28 |
| 2006/0133143 A1 | * | 6/2006 | Hosono | .................. 365/185.11 |

FOREIGN PATENT DOCUMENTS

| JP | 2001-084777 | 3/2001 |
| JP | 2003-257189 | 9/2003 |
| JP | 2004-071092 | 3/2004 |
| KR | 10-1996-0035648 | 10/1996 |
| KR | 10-0311339 | 11/1998 |
| KR | 10-20010010734 A | 2/2001 |
| KR | 20010061470 A | 7/2001 |
| WO | WO 98/44511 A1 | 1/1998 |

OTHER PUBLICATIONS

Notice to File a Response/Amendment to the Examination Report corresponding to Korean Patent Application No. 10-2004-0095242 mailed Mar. 9, 2006.
Notice to Submit a Response/Amendment to the Examination Report for Korean Patent Application No. 10-2004-0103528 mailed on May 29, 2006.

* cited by examiner

*Primary Examiner*—Tuan T. Nguyen
*Assistant Examiner*—Hien N Nguyen
(74) *Attorney, Agent, or Firm*—Myers Bigel Sibley & Sajovec, PA

(57) ABSTRACT

Memory cells in a memory cell array are erased using an erase operation followed by a post-program operation. In the erase operation, an erase voltage is applied to a plurality of memory cells of the memory cell array. In the post program operation, a program voltage is simultaneously applied to at least two word lines coupled to ones of the plurality of erased memory cells of the memory cell array. Related devices are also discussed.

27 Claims, 9 Drawing Sheets

METHODS FOR ACCELERATED ERASE OPERATIONS IN NON-VOLATILE MEMORY DEVICES AND RELATED DEVICES

CROSS-REFERENCE TO RELATED APPLICATIONS

This application claims priority under 35 U.S.C. § 119 from Korean Patent Application 10-2004-94701 filed on Nov. 18, 2004, and Korean Patent Application No. 10-2004-95242 filed on Nov. 19, 2004 the disclosures of which are hereby incorporated by reference herein in their entirety.

FIELD OF THE INVENTION

The present invention relates to semiconductor memory devices, and, more particularly, to write/erase operations in semiconductor memory devices.

BACKGROUND OF THE INVENTION

Flash memory is a type of EEPROM that allows multiple memory locations/regions to be erased or written/programmed in one programming operation. In a conventional EEPROM, only one memory location/region at a time may be erased or programmed. As such, flash memory devices can be operated at higher effective speeds when systems employing flash memory devices read and write to more than one memory region at the same time. Many types of flash memory and/or EEPROM may "wear out" after a certain number of erase operations, for example, due to wear on the insulating layers covering charge storage means used in storing data.

Flash memory devices are non-volatile devices, which can store information on a silicon chip in a manner that may not require power to maintain the information stored in the silicon chip. In other words, information may be stored in flash memory devices even if power is cut off. In addition, flash memory devices may provide a resistance to physical impact and relatively fast read access times. Accordingly, flash memory devices may be used for storage in battery-powered devices. Flash memory devices may be classified into two groups, NOR flash and NAND flash, based on the type of logic gate used in each storage device.

Flash memory devices may store information in an array of transistors, called "cells", each of which may store 1-bit of information. Newer flash memory devices (called "multi-level devices") can store more than 1-bit per cell, by varying the number of electrons stored on the floating gate of a cell.

A NOR-type flash memory device may be similar to a standard MOSFET transistor, except that each cell may have two gates. One gate may be a control gate CG similar to other MOS transistors, while the second gate may be a floating gate FG insulated by an oxide layer. The floating gate may be located between the control gate and the (bulk) substrate. Since the floating gate may be insulated by the oxide layer, electrons on the floating gate may be trapped, and accordingly, information may be stored. When electrons are trapped on the floating gate, an electric field from the control gate may be modified (i.e., at least partially cancelled out), which may modify a threshold voltage Vt of the cell. Thus, when the cell is "read" by applying a specific voltage to the control gate, electrical current may either flow or not flow depending on the threshold voltage of the cell, which may be controlled by the electric charge on the floating gate. The presence or absence of current may be sensed and interpreted as "1" or "0", to reproduce the stored data. In a multi-level cell device, which may store more than 1-bit per cell, the amount of current, rather than the presence or absence of current, may be sensed to determine the number of electrons stored on the floating gate.

A NOR-type flash cell may be programmed (set to a specific data value) by applying a program voltage to the control gate. Under these bias conditions, a relatively large amount of current may flow from a drain to a source in a process called "hot-electron injection". In order to erase the NOR-type flash cell, a relatively large voltage differential is applied between the control gate and the substrate (or bulk), which may remove electrons from the floating gate via Fowler-Nordheim tunneling. NOR-type flash memory devices may be divided into erase segments, which may be called "blocks" or "sectors". All memory cells in a sector may be erased at the same time. NOR programming, however, may be performed one byte or word unit at a time.

Erase operations in a NOR-type flash memory device may include a pre-program operation, a main erase operation, and a post-program operation. The pre-program operation may be performed using bias conditions similar to a program operation, which may prevent memory cells from being over-erased into depletion in a subsequent main erase operation. All memory cells in a sector to be erased may be pre-programmed. Next, a main erase operation may be performed such that all memory cells in the sector may have an on-state. Finally, a post-program operation may be performed to adjust the threshold voltage Vt of the memory cells that are erased in the main erase interval to approximately the same level. Except for the bias conditions, the post-program operation may be performed in a manner similar to that of the pre-program operation. In other words, memory cells connected to each of word lines (or rows) may be post-programmed one byte or word unit at a time.

However, because NOR post-programming operations may be performed one byte or word unit at a time, NOR-type flash memory devices which employ the above-described erase operations may require a relatively long interval of time to perform the pre-program and post-program operations of the erasing process.

SUMMARY OF THE INVENTION

According to some embodiments of the present invention, an erase method for a non-volatile memory device including an array having memory cells arranged in a matrix format of rows and columns may include erasing the memory cells of the array, selecting at least two of the rows simultaneously during a post-program operation and post-programming erased memory cells coupled to the simultaneously selected rows.

In some embodiments, a verification operation may not be performed with respect to the post-programmed memory cells during the post-program operation.

In other embodiments, the erased memory cells of the simultaneously selected rows may be programmed by a predetermined column unit.

In some embodiments, selecting and post-programming may be repeated until all memory cells of the array are post-programmed.

In other embodiments, the memory cells may be pre-programmed to have an off-state before erasing the memory cells.

In some embodiments, the verification operation may not be performed with respect to the pre-programmed memory cells during the pre-program operation.

According to further embodiments of the present invention, an erase method for a non-volatile memory device including a memory cell array having sectors arranged in a matrix format of rows and columns may include erasing memory cells of the sectors, selecting a word line of each sector included in a same row during a post-program operation, and post-programming erased memory cells coupled to the simultaneously selected word lines.

In some embodiments, a verification operation may not be performed with respect to the post-programmed memory cells during the post-program operation.

In other embodiments, the memory cells of each of the sectors may be pre-programmed to have an off-state before erasing the memory cells.

In some embodiments, the verification operation may not be performed with respect to the pre-programmed memory cells during the pre-program operation.

According to other embodiments of the present invention, a method of erasing a memory cells in a memory cell array may include an erase operation and a post-program operation. An erase voltage may be applied to erase a plurality of memory cells of the memory cell array in the erase operation. Then, a program voltage may be simultaneously applied to at least two word lines coupled to ones of the plurality of erased memory cells of the memory cell array in the post-program operation. However, in some embodiments, the program voltage may be simultaneously applied to at least two but less than all of the word lines.

In some embodiments, two word lines coupled to ones of the plurality of erased memory cells may be selected responsive to an accelerated post-program control signal. The program voltage may be simultaneously applied to the selected word lines.

In other embodiments, a pre-program voltage may be sequentially applied to word lines coupled to ones of the plurality of memory cells in a pre-program operation prior to the erase operation.

In some embodiments, respective threshold voltages of the ones of the plurality of erased memory cells may not be verified after the erase operation.

In other embodiments, the plurality of memory cells may include a first plurality of memory cells in a first memory sector and a second plurality of memory cells in a second memory sector. The program voltage may be simultaneously applied to a first word line coupled to ones of the first plurality of memory cells in the first memory sector, and to a second word line coupled to ones of the plurality of memory cells in the second memory sector.

In some embodiments, the memory cell array may include a plurality of memory sectors arranged in a matrix format of banks and mats. The first and second memory sectors may be respectively included in first and second banks of a common mat. In other embodiments, the program voltage may be simultaneously applied to at least one word line in each of the plurality of memory sectors included in the common mat.

According to still other embodiments of the present invention, a memory device may include a memory cell array, a plurality of memory cells in the memory cell array, and a plurality of word lines coupled to ones of the plurality of memory cells. A controller may be configured to apply an erase voltage to the plurality of memory cells in an erase operation. A word line driver circuit may be configured to simultaneously apply a program voltage to at least two of the plurality of word lines in a post-program operation.

In some embodiments, the memory device may further include a word line selector circuit. The word line selector circuit may be configured to select two of the plurality of word lines after the erase operation responsive to an accelerated post-program control signal from the controller. The word line driver circuit may be coupled to the word line selector circuit and may be configured to simultaneously apply the program voltage to the selected word lines.

In other embodiments, the word line driver circuit may be configured to sequentially apply a pre-program voltage to the plurality of word lines in a pre-program operation prior to the erase operation.

In some embodiments, the controller may be configured not to verify respective threshold voltages of ones of the plurality of memory cells coupled to the at least two of the plurality of word lines after the erase operation.

In other embodiments, the memory cell array may include a plurality of memory sectors arranged in a matrix format of banks and mats, and the plurality of memory cells may include a plurality of memory cells in each memory sector. The word line driver circuit may be configured to simultaneously apply the program voltage to at least one of the plurality of word lines coupled to ones of the plurality of memory cells in at least two of the plurality of memory sectors.

In some embodiments, the word line driver circuit may be further configured to simultaneously apply the program voltage to at least one of the plurality of word lines coupled to ones of the plurality of memory cells in each of the plurality of memory sectors included in a common mat.

In other embodiments, the word line driver circuit may be configured to simultaneously apply the program voltage to at least two but less than all of the plurality of word lines in the post-program operation.

DETAILED DESCRIPTION OF EMBODIMENTS OF THE INVENTION

The present invention now will be described more fully hereinafter with reference to the accompanying drawings, in which illustrative embodiments of the invention are shown.

However, this invention may be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "coupled", "connected" or "responsive" to another element, it can be directly coupled, connected or responsive to the other element or intervening elements may also be present. In contrast, when an element is referred to as being "directly coupled", "directly connected" or "directly responsive" to another element, there are no intervening elements present. Like numbers refer to like elements throughout. As used herein the term "and/or" includes any and all combinations of one or more of the associated listed items and may be abbreviated by "/".

It will also be understood that, although the terms first, second, etc. may be used herein to describe various elements, these elements should not be limited by these terms. These terms are only used to distinguish one element from another element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
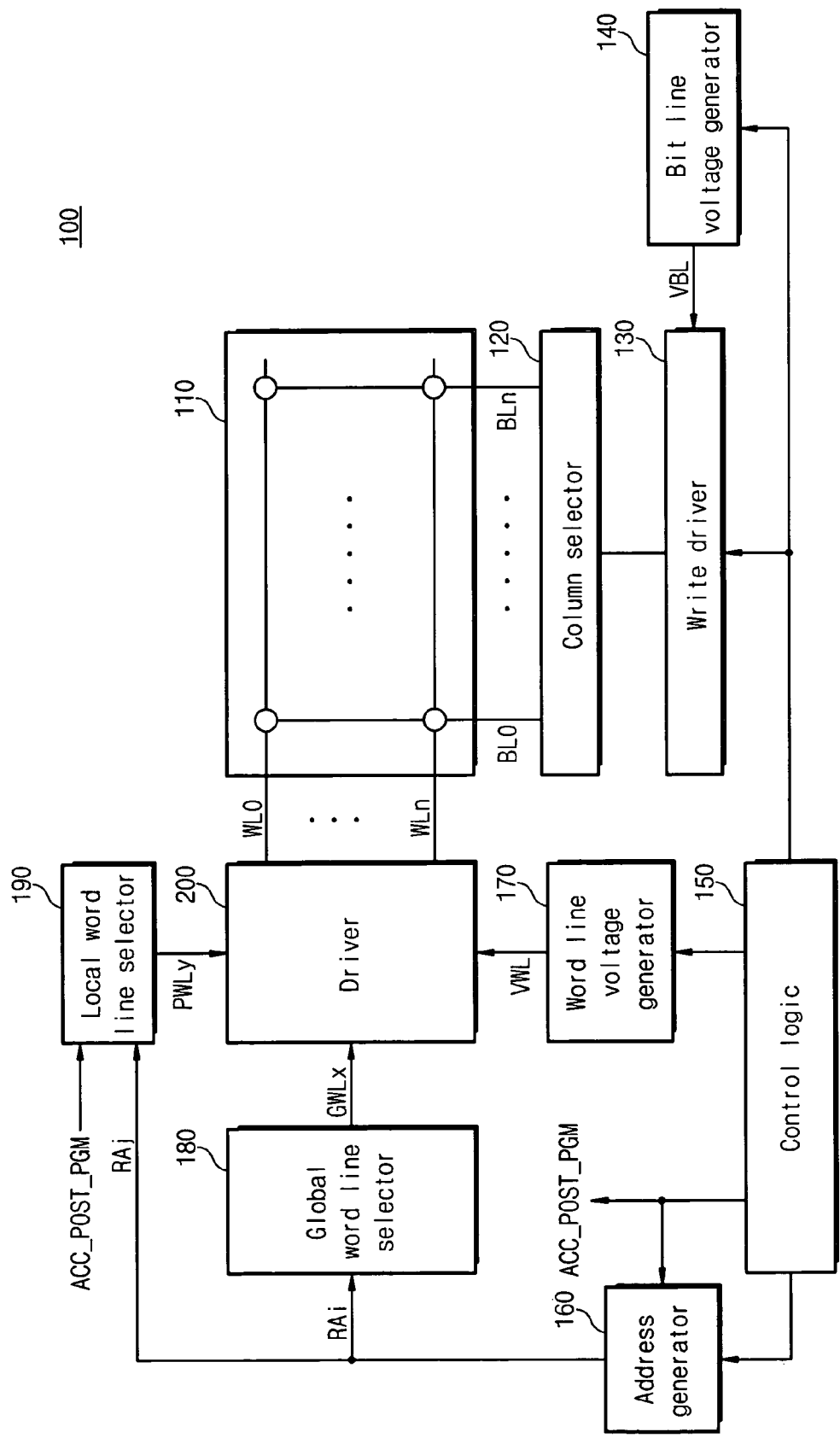
FIG. 1 is a schematic circuit diagram illustrating a non-volatile memory device according to some embodiments of the present invention.

FIG. 1 is a schematic block diagram of a non-volatile memory device according to some embodiments of the present invention. While the non-volatile memory device illustrated in FIG. 1 is a NOR-type flash memory device, it is to be understood that embodiments of the present invention may be applicable to other types of memory devices, such as MROM, PROM, FRAM, and/or NAND-type flash memory devices.

Referring now to FIG. 1, the non-volatile memory device 100 includes a memory cell array 110 for storing N-bit data information (where N=1 or an integer greater than 1). The memory cell array 110 includes one or more memory cells (denoted by a circle in FIG. 1) arranged in a matrix of word lines (or rows) WL0–WLm and bit lines (or columns) BL0–BLn. A column selector circuit 120 selects bit lines BL0–BLn based on a predetermined unit (e.g., one byte or word unit at a time). A write driver circuit 130 is controlled by control logic 150, and drives the selected bit lines by a bit line voltage VBL provided by a bit line voltage generating circuit 140. The bit line voltage generating circuit 140 is controlled by the control logic 150 (also referred to as a controller). The control logic 150 is configured to control operations of the memory device 100 in multiple operation modes. For example, the control logic 150 is configured to activate a control signal ACC_POST_PGM during a post-program operation of an erase process.

An address generating circuit 160 generates row address signals RAi and RAj in response to a control signal from the control logic 150 during a pre-program and a post-program operation. More particularly, the address generating circuit 160 is configured to alter the row address RAi according to whether the control signal ACC_POST_PGM is activated. For example, the row address RAi may be a 3-bit address. If the control signal ACC_POST_PGM is not activated, the 3-bit address may be sequentially increased/decreased. However, if the control signal ACC_POST_PGM is activated, only part of the 3-bit address (e.g., the upper 2-bits) may be sequentially increased/decreased, and the remainder of the 3-bit address (e.g., the lower bit) may not be changed, as will be more fully described in detail hereinafter. A word line voltage generating circuit 170 is also controlled by the control logic 150, and is configured to generate a word line voltage VWL.

Still referring to FIG. 1, the non-volatile memory device 100 further includes a global word line selector circuit 180, a local word line selector circuit 190, and a word line driver circuit 200.

The global word line selector circuit 180 selects a global word line selection signal GWLx in response to the row address RAj from the address generating circuit 160. The local word line selector circuit 190 is operated in response to the control signal ACC_POST_PGM from the control logic 150, and activates some of the word line selection signals PWLy (e.g., one or more signals, but less than all signals in some embodiments) according to the row address RAj from the address generating circuit 160. For example, when the control signal ACC_POST_PGM is inactivated, the local word line selector circuit 190 activates one of the local word lines selection signals PWLy in response to the row address RAj. In contrast, when the control signal ACC_POST_PGM is activated, the local word line selector circuit 190 simultaneously activates two or more of the local word line selection signals PWLy in response to the row address RAj. However, in some embodiments, the local word line selector circuit 190 may simultaneously activate less than all of the local word line selection signals PWLy. The non-volatile memory device 100 may have a conventional hierarchical word line structure, in which one global word line corresponds to a plurality of word lines. As such, the word line driver circuit 200 selects some (but in some embodiments, less than all) of the word lines in response to the global word line selection signals and the local word line selection signals, and drives the selected word line(s) at a word line voltage $V_{WL}$. For instance, when one global word line selection signal is activated, and one local word line selection signal is activated (i.e., when the control signal ACC_POST_PGM is inactivated), the word line driver circuit 200 drives one word line at the word line voltage $V_{WL}$. Also, when one global word line selection signal is activated, and two local word line selection signals are activated (i.e., when the control signal ACC_POST_PGM is activated), the word line driver circuit 200 drives two word lines at the word line voltage $V_{WL}$ at the same time.

Consequently, the non-volatile memory device 100 is configured such that when the control signal ACC_POST_PGM is activated, two word lines may be selected/driven at the same time, and when the control signal ACC_POST_PGM is inactivated, one word line may be selected/driven. As described above, the control signal ACC_POST_PGM is activated during a post-program operation of an erase process, to provide an "accelerated" post-program operation.

Accordingly, since at least two word lines may be selected at the same time during the post program operation, the time required to perform the post-program operation may be reduced.

Figure 2:
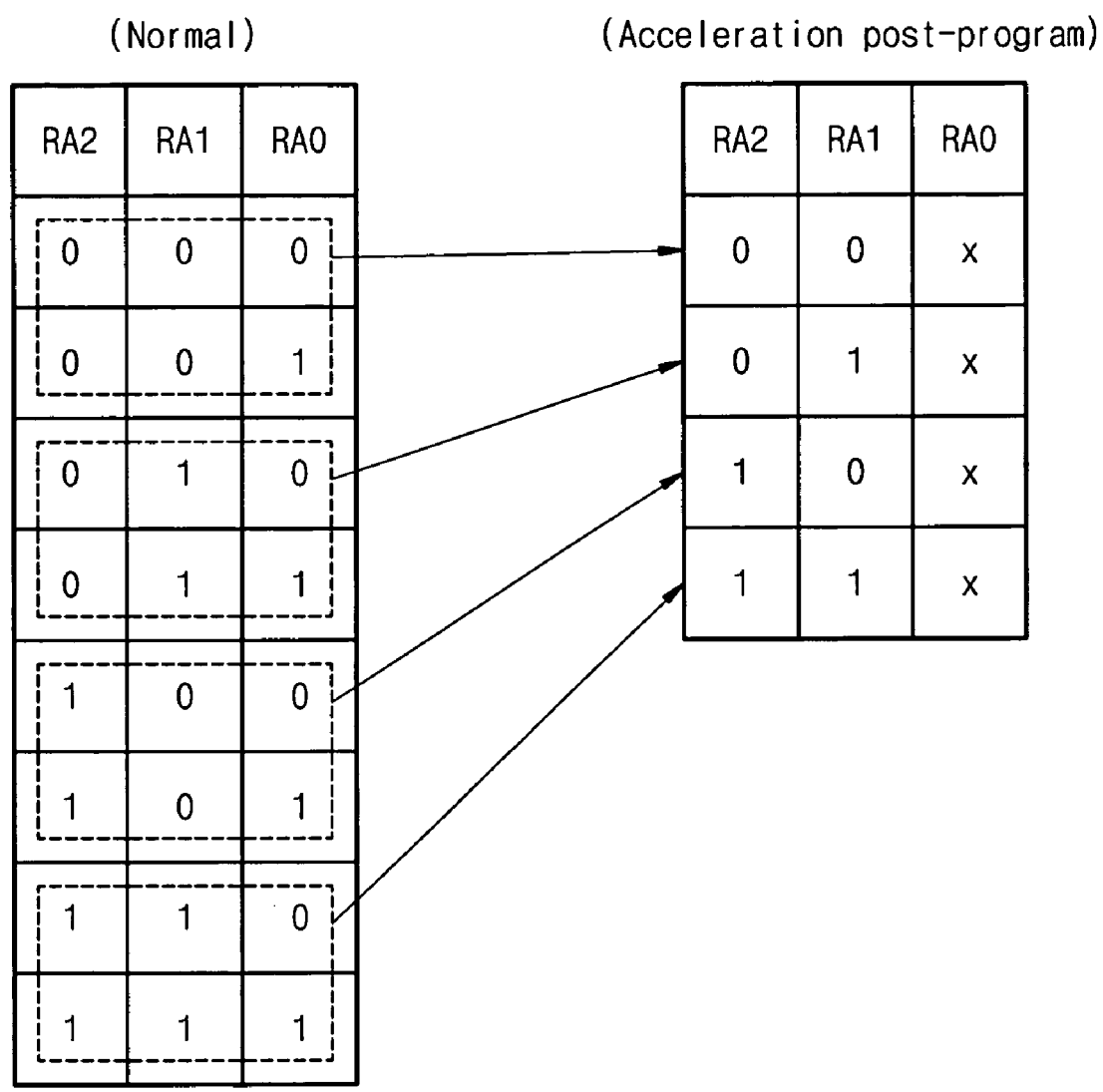
FIG. 2 illustrates an example of an output of an address generating circuit according to some embodiments of the present invention.

FIG. 2 illustrates an example of an output of the address generating circuit 160 of FIG. 1. Referring to FIG. 2, the address generating circuit 160 is configured to sequentially increase/decrease a 3-bit sequence defined by address signals RA0–RA2 during normal operations and/or when the control signal ACC_POST_PGM is inactivated. Also, the address generating circuit 160 is configured to sequentially increase/decrease two upper bits RA1 and RA2 of the 3-bit sequence when the control signal ACC_POST_PGM is activated. In this case, the third bit RA0 is a "don't care" bit.

Figure 3A:
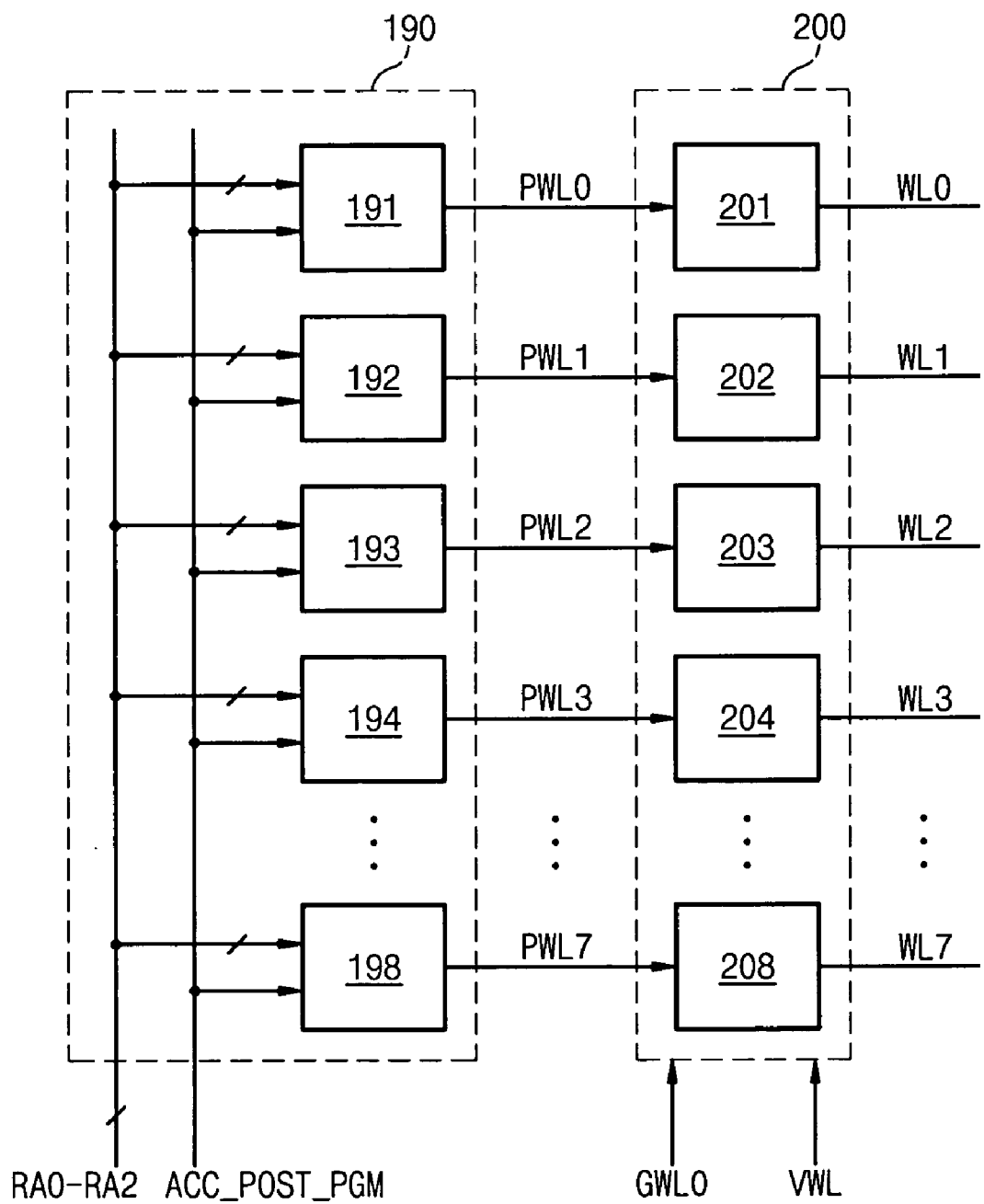
FIG. 3A is a schematic block diagram of a local word line selecting circuit according to some embodiments of the present invention.
Figure 3B:
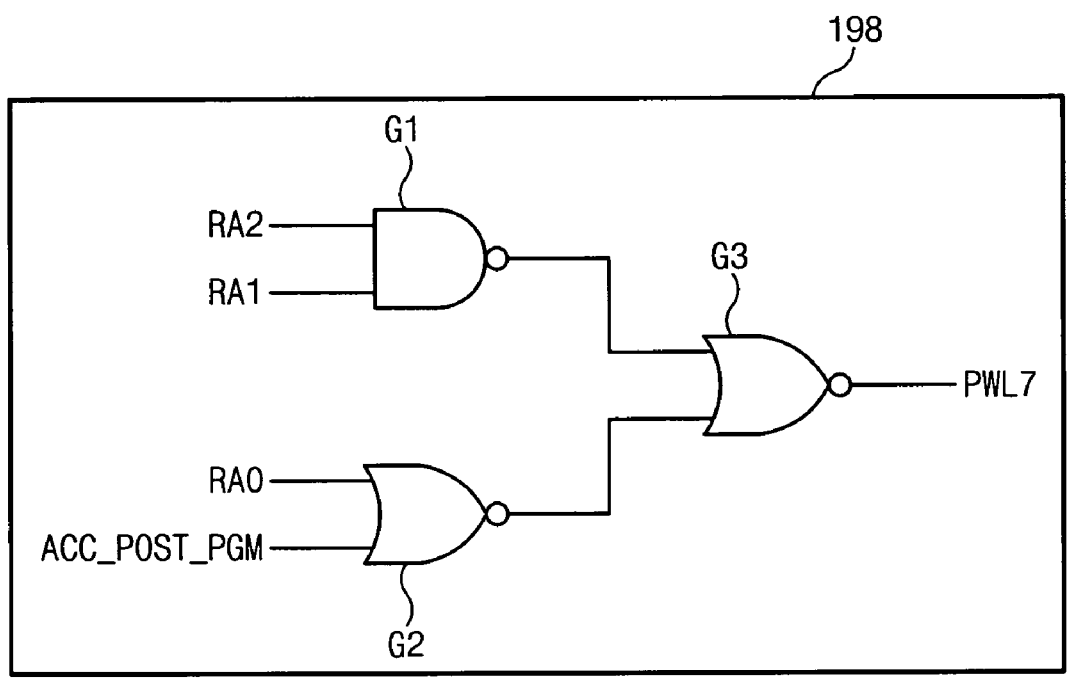
FIG. 3B is a circuit diagram of a decoder according to some embodiments of the present invention.

FIG. 3A is a block diagram illustrating the local word line selector circuit 190 and the word line driver circuit 200 of FIG. 1. FIG. 3B is a circuit diagram illustrating one of the decoders of FIG. 3A.

Referring to FIG. 3A, the local word line selector circuit 190 includes a plurality of decoders (for example, eight decoders 191–198). Row address signals RA0–RA2 and the control signal ACC_POST_PGM are applied to each of the decoders 191–198. The row address signals RA0–RA2 are configured to select word lines (for example, eight word lines) corresponding to one global word line. Each of the decoders 191–198 decodes the input row address signals RA0–RA2 to respectively generate local word line selection signals PWL0–PWL7.

Referring now to FIG. 3B, the decoder 198 includes a NAND gate G1 and a NOR gates G2 and G3. When the control signal ACC_POST_PGM is not activated, one local word line selection signal is activated responsive to the input address signals RA0–RA2. When the control signal ACC_POST_PGM is activated, as described above, the address signal RA0 representing the lowest bit of the 3-bit sequence is disregarded. As a result, each of the decoders activates a corresponding local word line signal in response to upper address signals RA1 and RA2. Accordingly, when the control signal ACC_POST_PGM is activated, two local word line signals are activated at the same time. For instance, when the address signals RA2 and RA1 are "00", the decoders 191 and 192 activate corresponding word lines selection signals PWL0 and PWL1 at the same time. When the address signals RA2 and RA1 are "01", the decoders 193 and 194 activate corresponding local word line selection signals PWL2 and PWL3 at the same time. As such, during the accelerated post-program operation (i.e., when the control signal ACC_POST_PGM is activated), two local word line selection signals are activated simultaneously.

Referring again to FIG. 3A, the word line driver circuit 200 is responsive to global word line GWL0, and drives some of the word lines at the word line voltage $V_{WL}$ in response to the word line selection signals PWL0–PWL7. For example, when one local word line selection signal is activated, only one word line is activated responsive to activation of the global word line selection signal. Also, when two local word line selection signals are activated, two word lines are activated responsive to activation of the global word line selection signal.

Figure 4:
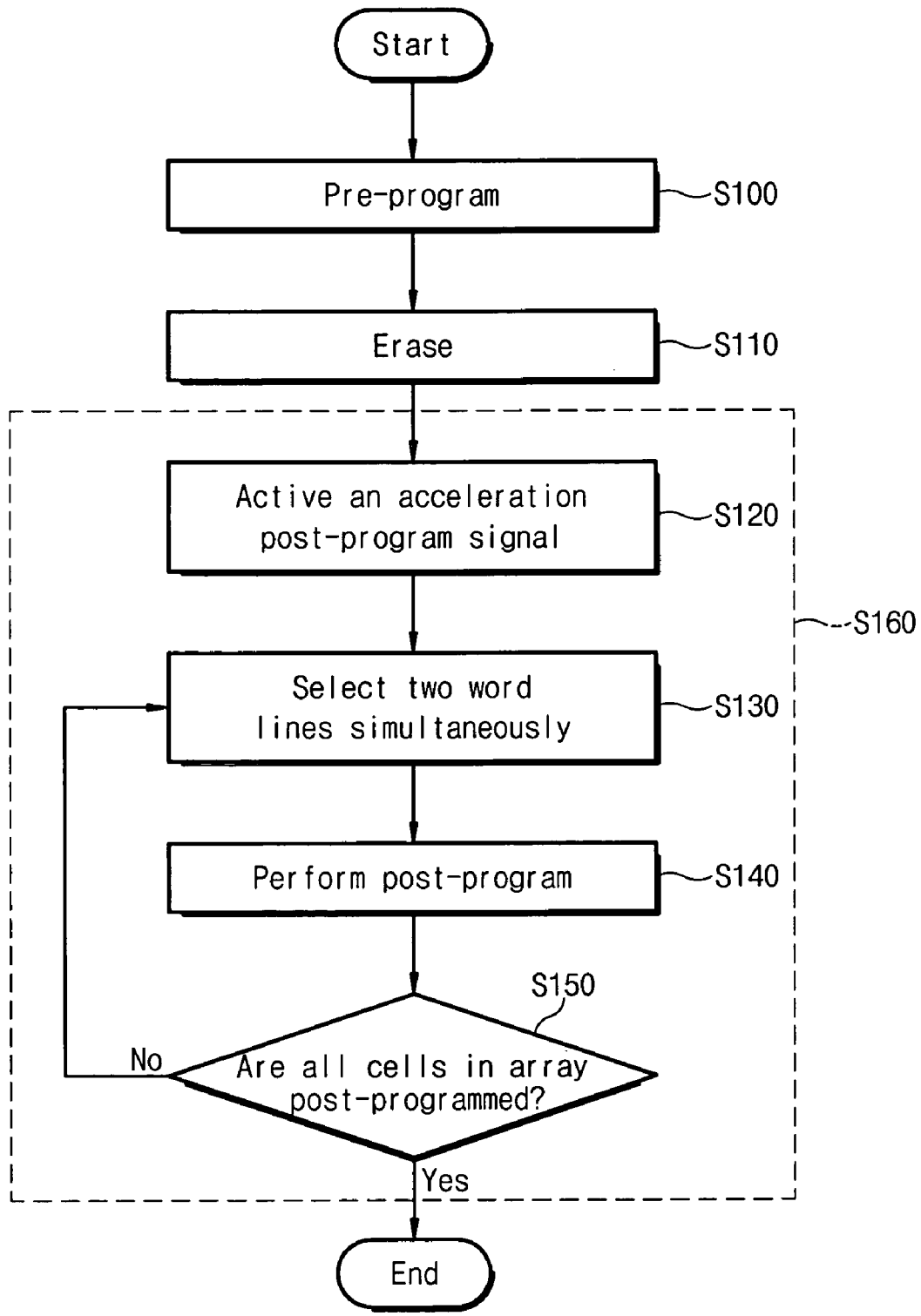
FIG. 4 is a flowchart illustrating erasing operations for non-volatile memory devices according to some embodiments of the present invention.

FIG. 4 is a flowchart illustrating operations in an erase process for non-volatile memory devices according to some embodiments of the present invention. The erasing process may include a pre-program operation, a main erase operation, and a post-program operation.

During the pre-program operation, all memory cells are pre-programmed using bias conditions similar to a conventional program operation (S100), in order to prevent memory cells from being over-erased into depletion during the subsequent main erase operation. In accordance with the pre-program operation, an entire row is selected, and memory cells of a row are selected based on a predetermined unit (e.g., by one byte or word unit at a time). Once all memory cells of the selected row are pre-programmed, the next row is selected. By repeating this process, all of the memory cells may be programmed. During the pre-program operation, a verification operation may not be performed. In other words, all memory cells are pre-programmed to have an off-state without checking whether the pre-programming was successful. After that, all memory cells are erased in a conventional manner at the same time so as to have an on-state (S110). After the main erasing operation is completed, an accelerated post-program operation according to some embodiments of the present invention is performed (S160). This operation will be more fully described hereinafter.

In the accelerated post-program operation, the control logic 150 activates the control signal ACC_POST_PGM after the main erasing operation is completed (S120). The address generating circuit 160 generates row addresses RAi and RAj based on the control signal from the control logic 150. For example, when the control signal ACC_POST_PGM is activated, as described above, only the upper bits of the address signals RA0–RA2 are varied. The global word line selector circuit 180 activates one of the global word line selection signals GWLx (e.g., GWL0) in response to the row address RAi. Also, the local word line selector circuit 190 activates at least two of the local word line selection signals PWL0–PWL7 in response to the control signal ACC_POST_PGM and the row address signals RA1 and RA2. For example, when the address signals RA1 and RA2 are "00", the decoders 191 and 192 activate corresponding local word line selection signals PWL0–PWL1. Accordingly two word lines WL0 and WL1 are simultaneously driven at the word line voltage $V_{WL}$. In other words, during the accelerated post-program operation, two word lines are activated at the same time. In addition, a column selector circuit 120 sequentially selects columns/bit lines BL0–BLn, and the selected columns are driven at a bit line voltage $V_{BL}$ by a write driver circuit 130. As such, memory cells connected to the selected word lines WL0–WL1 are post-programmed (S140).

Next, it is determined whether all cells of the memory cell array are post-programmed (S150). If all cells of the memory cell array are not post-programmed, blocks S130–S150 are repeated until all word lines are selected and post-programmed. If all cells of the memory cell array are post-programmed, the erasing process is completed. According to the accelerated post-program operation, like the pre-program operation, all memory cells may be post-programmed without a program verification operation. In other words, the memory cells are not checked to verify that the post-programming was successful.

Figure 5:
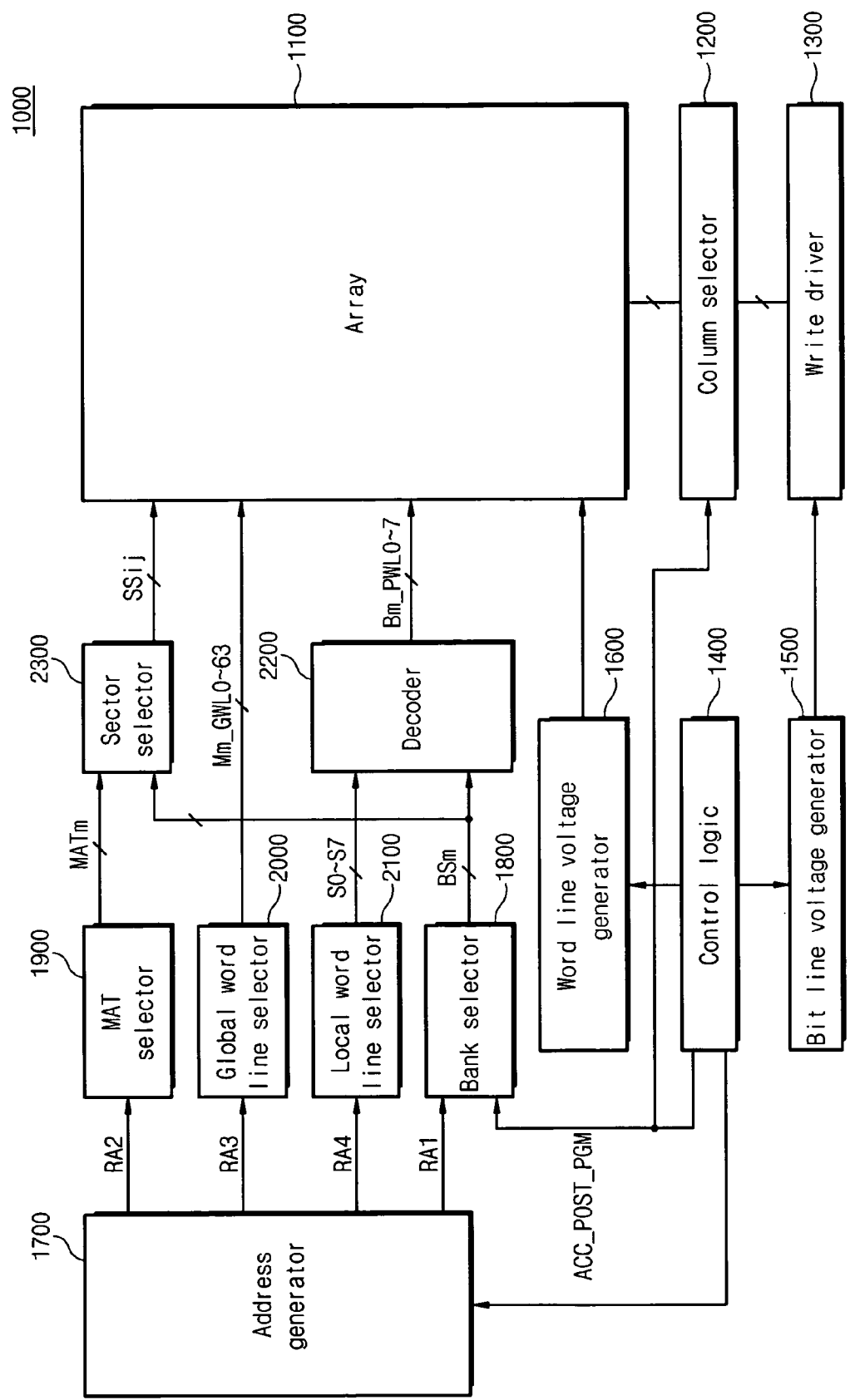
FIG. 5 is a schematic block diagram of a non-volatile memory device according to a further embodiments of the present invention.

FIG. 5 is a schematic block diagram illustrating a non-volatile memory device according to further embodiments of the present invention.

Figure 6:
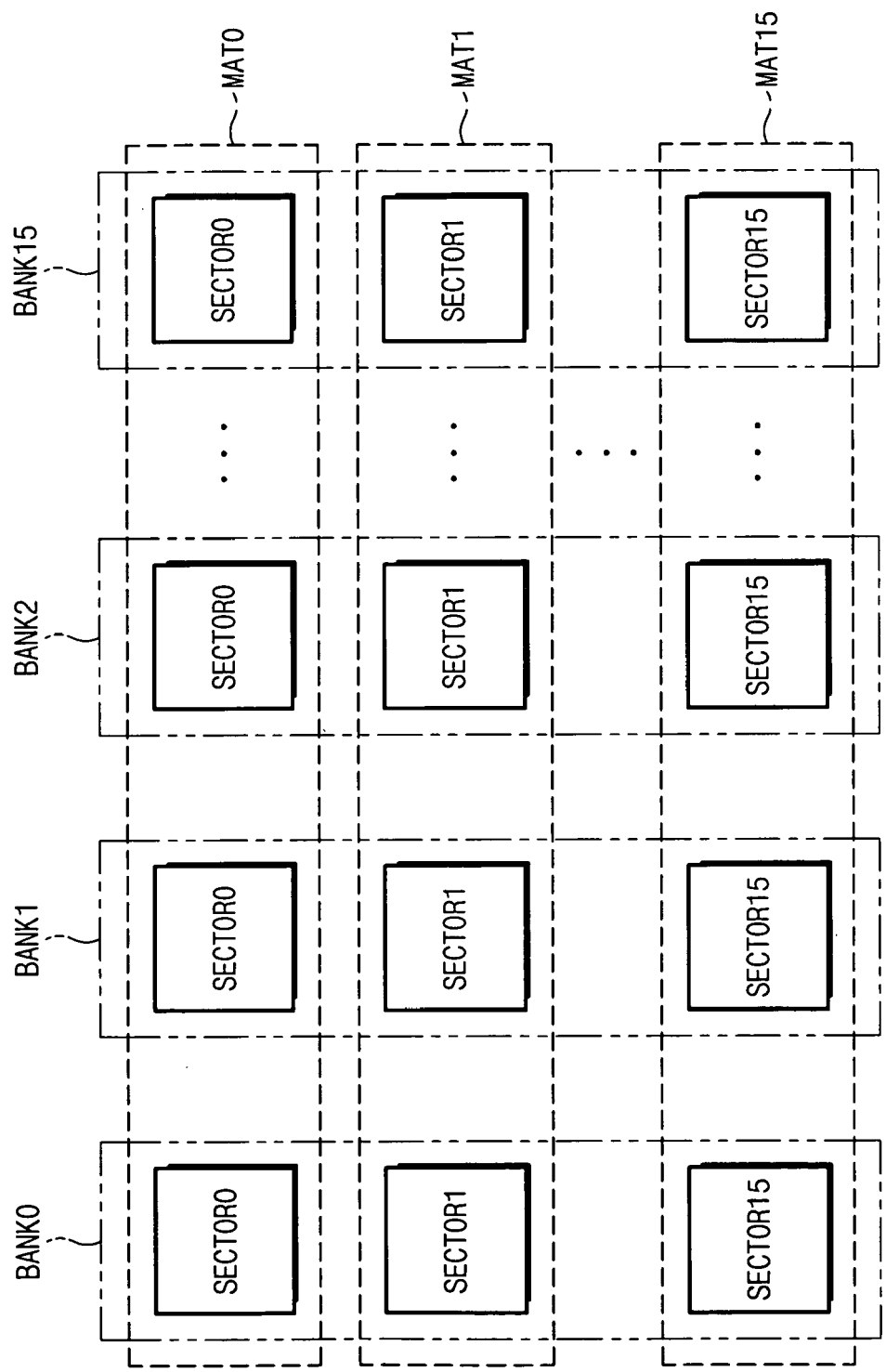
FIG. 6 illustrates a structure of a memory cell array according to some embodiments of the present invention.

Referring to FIG. 5, the non-volatile memory device 1000 includes a memory cell array 1100 for storing N-bit data (where N=1 or an integer greater than 1). The memory cell array 1100, as shown in FIG. 6, includes a plurality of banks BANKm (m=0–15) and rows/mats MATm (m=0–15). Each of the banks BANKm includes a plurality of memory sectors SECTORm. Although not shown, each of the sectors includes memory cells arranged in a matrix format of rows and columns. Memory cells included in one sector are erased simultaneously. A column selector circuit 1200 is operated responsive to a control signal ACC_POST_PGM from control logic 1400, and is configured to select columns of a sector included in the selected bank(s) by a predetermined unit (e.g., by one byte or word unit at a time). The control signal ACC_POST_PGM is activated during a post-program operation of an erasing process. When the control signal ACC_POST_PGM is activated, the column selector circuit selects columns of each of the banks BANKm by a predetermined unit. When the control signal ACC_POST_PGM is not activated, the column selector circuit 1200 selects one of the columns among the banks BANKm by a predetermined unit. The selected columns are driven at a bit line voltage from a bit line voltage generating circuit 1500 by a write driver circuit 1300 during pre- and post-program operations.

The control logic 1400 (also referred to as a controller) is configured to control operations of the memory device. The control logic 1400 activates the control signal ACC_POST_PGM during the post-program interval. The bit line voltage generating circuit 1500 generates a bit line voltage based on the control signal from the control logic 1400. The bit line voltage generating circuit 1500 may be configured to generate a bit line voltage from an external voltage source during the post-program operation. In addition, the bit line voltage may be supplied by an external voltage source. The word-line voltage generating circuit 1600 generates a word line voltage based on the control signal from the control logic 1400. The word line voltage generating circuit 1600 may be configured to generate a word line voltage from an external voltage source during the post-program operation. In addition, the word line voltage may be supplied by an external voltage source during the post-program operation.

The address generating circuit 1700 is controlled by the control logic 1400 and generates a row address. The row address includes address information RA1 for selecting a bank (hereinafter, referred to as a "first row address"), address information RA2 for selecting mat (hereinafter, referred to as a "second row address"), address information RA3 for selecting a global word line (hereinafter, referred to as a "third row address"), and address information RA4 for selecting a local word line (hereinafter, referred to as a "fourth row address"). As shown in FIG. 6, the memory cell array 110 has 16 banks. Each of the banks has 16 sectors. Each of the sectors includes 64 global word lines and 512 word lines (or local word lines). The memory device may have a hierarchical word line structure, in which one global word line corresponds to eight word lines. All sectors also include a plurality of mats. However, it is to be understood that memory cell array structure according to embodiments of the present invention are not limited to those shown in FIG. 6.

Still referring to FIG. 6, a bank selector circuit 1800 is controlled by the control signal ACC_POST_PGM and generates bank selection signals BS0–BS15 in response to the first row address RA1. The bank selection signals BS0–BS15 correspond to banks BANK0–BANK15, respectively. For example, when the control signal ACC_POST_PGM is activated (i.e., during a post-program operation), the bank selection circuit 1800 activates all bank selection signals BS0–BS15 regardless of the first row address RA1, or activates some (for example, two bank selection signals) of the bank selection signals BS0–BS15 in response to the first row address RA1.

A mat selector circuit 1900 generates mat selection signals MATm in response to the second row address RA2. The mat selection signals MATm correspond to the mats MAT0–MAT15, respectively. A sector selector circuit 2300 generates sector selection signals SSij (where, i represents the mat number of mat and j represents the bank number) in response to the bank selection signals BSm and the mat selection signals MATm. For instance, if the control signal ACC_POST_PGM is activated, the sector selector circuit 1900 generates the sector selection signals SSij in order that all sectors included in the same mat are selected. When the control signal ACC_POST_PGM is inactivated, the sector selector circuit 1900 generates the sector selection signals SSij to select only one sector. The global word line selector circuit 2000 generates global word line selection signals (Mm_GWL0–Mm_GWL63) in response to the third row address RA3. The global word line selection signals (Mm_GWL0–Mm_GWL63) select 64 global word lines for each mat MAT0–MAT15. For instance, the global word line selector circuit 2000 activates only one of the global word line selection signals (Mm_GWL0–Mm_GWL63) corresponding to a certain mat in response to the third row address RA3. The local word line selector circuit 2100 activates one of the local word line selection signals S0–S7 in response to the fourth row address RA4. The decoder circuit 220 generates word line selection signals Bm_PWL0–Bm_PWL7 in response to the selection signals S0–S7 and BSm. For example, when the bank selection signal BS0 is activated, the decoder circuit 2200 activates one of the selection signals B0_PWL0–B0_PWL7 according to the selection signals S0–S7. When all bank selection signals BS0–BS15 are activated (or the control signal ACC_POST_PGM is activated), the decoder circuit 2200 activates one of the selection signals Bm_PWL0–Bm_PWL7 for each of the banks based on the selection signals S0–S7. For example, when selection signal S0 is activated, selection signals (B0_PWL0, B1PWL_0 . . . B15_PWL0) are respectively supplied to all sectors included in the same mat, and word lines WL0 in each sector are activated at the same time.

Figure 7:
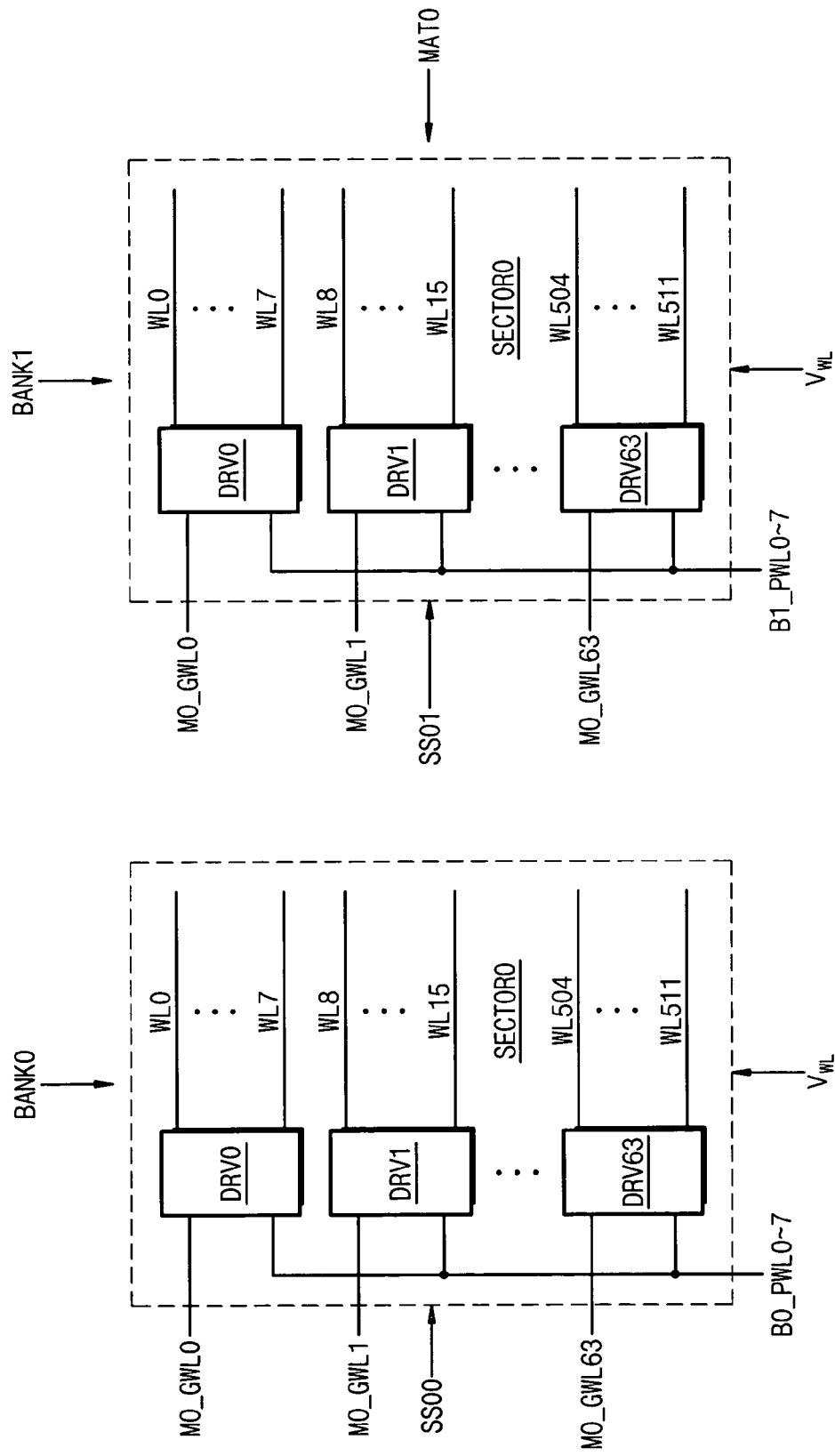
FIG. 7 is a schematic block diagram illustrating portions of sectors included in the same mat according to some embodiments of the present invention.

FIG. 7 is a block diagram illustrating memory sectors of the memory cell array 1100 shown in FIG. 5 according to further embodiments of the present invention. In FIG. 7, two sectors included in different banks and arranged in the same row (or mat) are shown. The sector SECTOR0 included in the bank BANK0 includes a word line driver circuit having driver blocks (DRV0–DRV63), which are respectively activated responsive to the selection signals (M0_GWL0–M0_GWL63). The sector SECTOR0 is selected by a sector selection signal SS00. The selection signals (B0_PWL0–B0_PWL7) are applied to driver blocks DRV0–DRV63. When the selection signals SS00, M0_GWL0, and B0_PWL0 are activated, the driver block DRV0 activates the word line WL0 in BANK0 at the word line voltage $V_{WL}$. The sector SECTOR0 included in the bank BANK1 includes a word line driver circuit having the driver blocks DRV0–DRV63, which are respectively activated responsive to the selection signals (MOGWL0–M0_GWL63). The sector SECTOR1 is selected by a sector selection signal SS01. The selection signals (B1_PWL0–B1_PWL7) are applied to the driver blocks DRV0–DRV63. When the selection signals SS01, M0_GWL0, and B1_PWL0 are activated, the driver block DRV0 activates the word line WL0 in BANK1 at the word line voltage $V_{WL}$.

Figure 8:
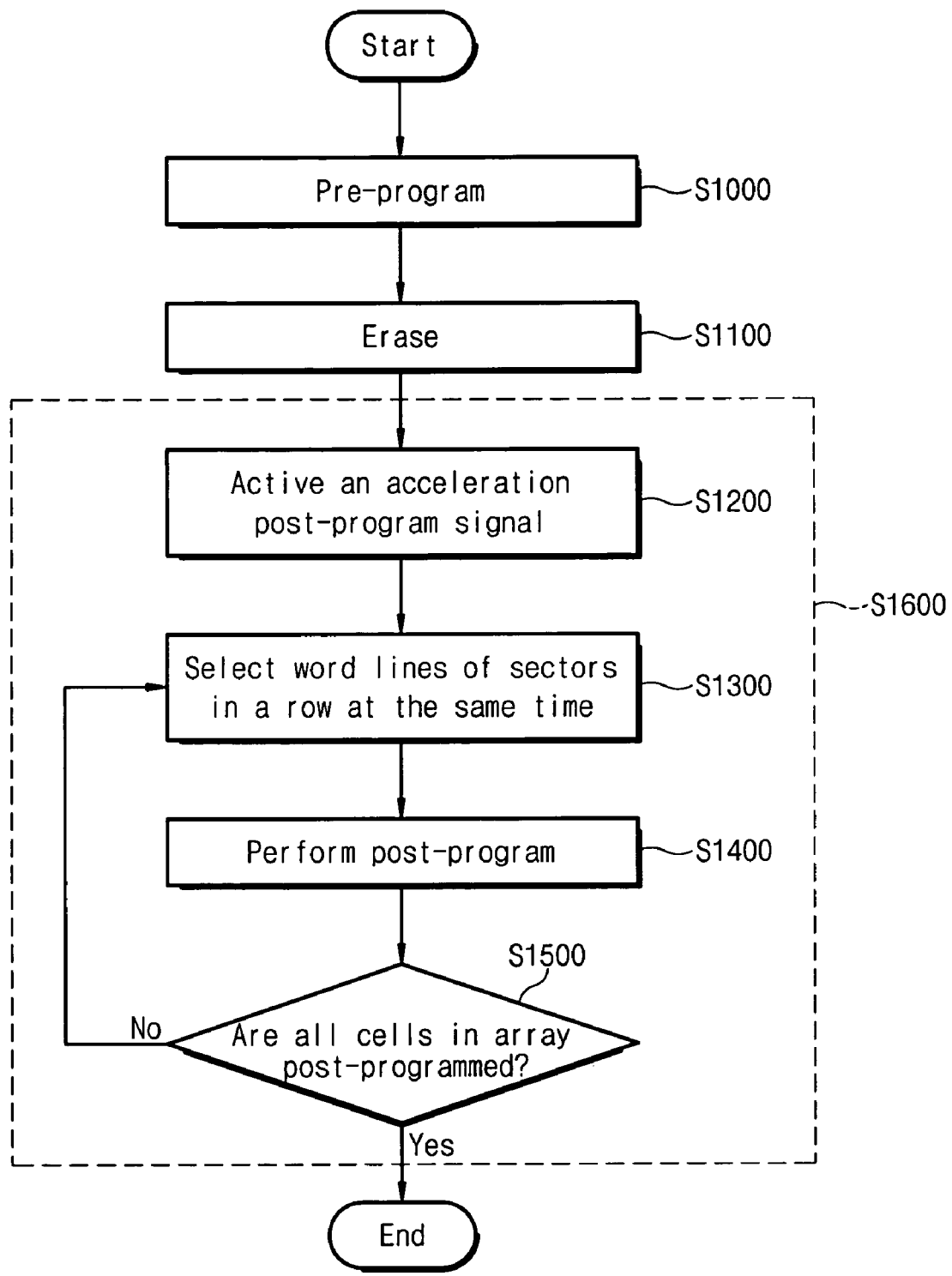
FIG. 8 is a flowchart illustrating erasing operations for non-volatile memory devices according to further embodiments of the present invention.

FIG. 8 is a flowchart illustrating an erasing process in non-volatile memory devices according to further embodiments of the present invention. The erasing process may include a pre-program operation, a main erase operation, and a post-program operation.

During the pre-program operation, all memory cells are pre-programmed using bias conditions similar to a conventional programming operation in order to prevent memory cells from being over-erased into depletion during the main erasing operation. In the pre-program operation, one word line is selected, and memory cells corresponding to the word line are selected by a predetermined unit (e.g., by a byte or word unit). When all memory cells corresponding to the selected word line are pre-programmed, the next word line is selected. By repeating this process, all memory cells in each sector may be programmed. During the pre-program operation, a verification operation may not be performed. In other words, all memory cells are pre-programmed to have an off-state without checking whether the pre-programming was successful. After that, all memory cells are erased in a conventional manner at the same time to have an on-state (S1100). After the main erasing operation is completed, a post-program operation (S1600) according to some embodiments of the present invention is performed as follows.

Still referring to FIG. 8, a control logic 1400 activates a control signal ACC_POST_PGM for post-programming after the main erase operation is completed (S1200), and an address generating circuit 1600 generates a row address based on the control signal from the control logic 1400. When the control signal ACC_POST_PGM is activated, a bank selector circuit 1800 activates all bank selection signals BS0–BS15; In another example, when the control signal ACC_POST_PGM is activated, the bank selector circuit 1800 activates some (for example, two or more bank selector signals) of the bank selection signals BS0–BS15 in response to the first row address RA1. When the control signal ACC_POST_PGM is activated, a mat selector circuit 1900 generates mat selection signals MAT0–MAT15 in response to the second row address RA2 and simultaneously generates sector selection signals (e.g., SS00–SS15) in response to input selection signals MATm and BSm. A global word line selector circuit 2000 activates one (e.g., M0_GWL0) of the selection signals (e.g., M0_GWL0–M0_GWL63) corresponding to a certain mat in response to the third row address RA3. A local word line selector circuit 2100 activates one (e.g., S0) of selection signals (S0–S7) in response to the fourth address RA4. A decoder 2220 simultaneously activates selection signals B0_PWL0–B15_PWL0 in response to input signals S0–S7 and BS0–BS15. As such, word lines of two or more sectors in the same mat/row are selected at the same time (S1300). For example, word lines WL0 of sector SECTOR0 in all banks BANK0–BANK15 are selected at the same time, and a word line voltage VWL is applied to the selected word line WL0. The sector SECTOR0 of banks BANK0–BANK15 are included in the same mat MAT0.

Then, a column selection circuit 1200 selects columns of the selected sectors in all banks by a predetermined unit in response to activation of the control signal ACC_POST_PGM. The columns are driven at a bit line voltage by a write driver circuit 1300 under the control of the control logic 1400. That is, during a post-program operation, memory cells connected to selected word lines of the respective sectors are post-programmed based on a predetermined unit (for example, a byte or word unit) at the same time (S1400). It is then determined whether or not all cells of the memory cell array are programmed (S1500). If all cells of the memory cell array are not programmed, blocks S1300–S1500 are repeated until all memory cells are post-programmed. If all cells of the memory cell array are post-programmed, the erasing process is completed. Like the pre-program operation, all memory cells may be post-programmed without using a program verification operation to determine whether the post-programming was successful.

Accordingly, a post-program operation may be performed such that at least two or more word lines are simultaneously selected, so that the time required for the post-program operation may be reduced. In addition, a post-program operation may be performed such that a plurality of word lines included in sectors of different banks of the same row (or mat) are selected at the same time, which may also reduce post-program time. Thus, the duration of an erase process can be reduced.

In the drawings and specification, there have been disclosed embodiments of the invention and, although specific terms are employed, they are used in a generic and descriptive sense only and not for purposes of limitation, the scope of the invention being set forth in the following claims.

That which is claimed:

1. An erase method for a non-volatile memory device including an array having memory cells arranged in a matrix format of rows and columns, the method comprising:
   erasing the memory cells of the array;
   selecting at least two of the rows simultaneously during a post-program operation; and
   post-programming erased memory cells coupled to the simultaneously selected rows.

2. The erase method as set forth in claim 1, wherein a verification operation is not performed with respect to the post-programmed memory cells during the post-program operation.

3. The erase method as set forth in claim 1, wherein the erased memory cells coupled to the simultaneously selected rows are post-programmed by a predetermined column unit.

4. The erase method as set forth in claim 1, further comprising repeating the selecting and post-programming steps until all memory cells of the array are post-programmed.

5. The erase method as set forth in claim 1, further comprising pre-programming the memory cells to have an off-state before erasing the memory cells.

6. The erase method as set forth in claim 5, wherein the verification operation is not performed with respect to the pre-programmed memory cells during the pre-program operation.

7. An erase method for a non-volatile memory device including a memory cell array having sectors arranged in a matrix format of rows and columns, the method comprising:
   erasing memory cells of the sectors;
   simultaneously selecting a word line of each sector included in a same row during a post-program operation; and
   post-programming erased memory cells that are coupled to the simultaneously selected word lines.

8. The erase method as set forth in claim 7, wherein a verification operation is not performed with respect to the post-programmed memory cells during the post-program operation.

9. The erase method as set forth in claim 7, wherein the erased memory cells coupled to the simultaneously selected word lines are post-programmed by a predetermined column unit.

10. The erase method as set forth in claim 7, further comprising repeating the selecting and post-programming steps until all memory cells of the memory cell array are post-programmed.

11. The erase method as set forth in claim 7, further comprising pre-programming the memory cells of each sector to have an off-state before erasing the memory cells.

12. The erase method as set forth in claim 7, wherein the verification operation is not performed with respect to the pre-programmed memory cells during the pre-program operation.

13. A method of erasing memory cells in a memory cell array, the method comprising:
applying an erase voltage to erase a plurality of memory cells of the memory cell array in an erase operation; and then
simultaneously applying a program voltage to at least two word lines coupled to ones of the plurality of erased memory cells in a post-program operation.

14. The method of claim 13, wherein simultaneously applying the program voltage comprises:
selecting two word lines coupled to ones of the plurality of erased memory cells responsive to an accelerated post-program control signal; and
simultaneously applying the program voltage to the selected word lines.

15. The method of claim 13, further comprising the following prior to applying the erase voltage:
sequentially applying a pre-program voltage to word lines coupled to ones of the plurality of memory cells in a pre-program operation.

16. The method of claim 13, wherein respective threshold voltages of the ones of the plurality of erased memory cells are not verified after the erase operation.

17. The method of claim 13, wherein the plurality of memory cells comprises a first plurality of memory cells in a first memory sector and a second plurality of memory cells in a second memory sector, and wherein simultaneously applying the program voltage to at least two word lines comprises:
simultaneously applying the program voltage to a first word line coupled to ones of the first plurality of memory cells in the first memory sector and to a second word line coupled to ones of the plurality of memory cells in the second memory sector.

18. The method of claim 17, wherein the memory cell array comprises a plurality of memory sectors arranged in a matrix format of banks and mats, and wherein the first and second memory sectors are respectively included in first and second banks of a common mat.

19. The method of claim 18, wherein simultaneously applying the program voltage to at least two word lines further comprises:
simultaneously applying the program voltage to at least one word line in each of the plurality of memory sectors included in the common mat.

20. The method of claim 13, wherein simultaneously applying the program voltage comprises:
simultaneously applying the program voltage to at least two but less than all of the word lines coupled to ones of the plurality of erased memory cells.

21. A memory device, comprising:
a memory cell array;
a plurality of memory cells in the memory cell array;
a plurality of word lines coupled to ones of the plurality of memory cells;
a controller configured to apply an erase voltage to the plurality of memory cells in an erase operation; and
a word line driver circuit configured to simultaneously apply a program voltage to at least two of the plurality of word lines in a post-program operation.

22. The device of claim 21, further comprising:
a word line selector circuit configured to select at least two of the plurality of word lines after the erase operation responsive to an accelerated post-program control signal from the controller,
wherein the word line driver circuit is coupled to the word line selector circuit and is configured to simultaneously apply the program voltage to the selected word lines.

23. The device of claim 21, wherein the word line driver circuit is configured to sequentially apply a pre-program voltage to the plurality of word lines in a pre-program operation prior to the erase operation.

24. The device of claim 21, wherein the controller is configured not to verify respective threshold voltages of ones of the plurality of memory cells coupled to the at least two of the plurality of word lines after the erase operation.

25. The device of claim 21, wherein the memory cell array comprises a plurality of memory sectors arranged in a matrix format of banks and mats, wherein the plurality of memory cells comprises a plurality of memory cells in each memory sector, and wherein the word line driver circuit is configured to simultaneously apply the program voltage to at least one of the plurality of word lines coupled to ones of the plurality of memory cells in at least two of the plurality of memory sectors.

26. The device of claim 24, wherein the word line driver circuit is further configured to simultaneously apply the program voltage to at least one of the plurality of word lines coupled to ones of the plurality of memory cells in each of the plurality of memory sectors included in a common mat.

27. The device of claim 21, wherein the word line driver circuit is configured to simultaneously apply the program voltage to at least two but less than all of the plurality of word lines in the post-program operation.

* * * * *